(12) United States Patent
Tsuda et al.

(10) Patent No.: US 10,507,552 B2
(45) Date of Patent: Dec. 17, 2019

(54) SOLDER MATERIAL AND ELECTRONIC COMPONENT

(71) Applicant: NIHON DEMPA KOGYO CO., LTD., Tokyo (JP)

(72) Inventors: Toshimasa Tsuda, Saitama (JP); Kenichi Kikuchi, Saitama (JP); Tomotaka Kuroda, Saitama (JP); Daisuke Nishiyama, Saitama (JP); Hiroyuki Sasaki, Saitama (JP); Makoto Hatano, Saitama (JP); Hiroya Ishikawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 824 days.

(21) Appl. No.: 15/015,104

(22) Filed: Feb. 3, 2016

(65) Prior Publication Data

US 2016/0226466 A1    Aug. 4, 2016

(30) Foreign Application Priority Data

Feb. 4, 2015 (JP) .................................. 2015-020559
Jun. 23, 2015 (JP) .................................. 2015-125871
Dec. 14, 2015 (JP) .................................. 2015-243504

(51) Int. Cl.
*B23K 35/26* (2006.01)
*C22C 30/02* (2006.01)
*C22C 30/04* (2006.01)
*H03H 9/10* (2006.01)

(52) U.S. Cl.
CPC ............ *B23K 35/262* (2013.01); *C22C 30/02* (2013.01); *C22C 30/04* (2013.01)

(58) Field of Classification Search
CPC ....... B23K 35/262; C22C 13/02; C22C 12/00; C22C 12/02; H03H 9/1092; B32K 35/0233
USPC ......... 420/561, 562, 576; 148/23; 228/111.5, 228/248.1, 254
See application file for complete search history.

(56) References Cited

U.S. PATENT DOCUMENTS

| 2002/0101304 A1* | 8/2002 | Onishi | H03H 9/02559 333/193 |
| 2008/0111203 A1* | 5/2008 | Pan | B81C 1/00285 257/415 |
| 2010/0272598 A1* | 10/2010 | Kim | B23K 35/262 420/560 |
| 2011/0180311 A1* | 7/2011 | Tsuda | B23K 1/0016 174/260 |
| 2014/0044479 A1* | 2/2014 | Ueshima | B23K 35/24 403/272 |

(Continued)

FOREIGN PATENT DOCUMENTS

| WO | 2007/055308 | 5/2007 | |
| WO | WO-2014024715 A1 * | 2/2014 | ........... B23K 35/262 |
| WO | WO-2014097390 A1 * | 6/2014 | ............. B23K 35/26 |

*Primary Examiner* — Lee E Sanderson
(74) *Attorney, Agent, or Firm* — JCIPRNET

(57) ABSTRACT

A solder material includes an alloy of at least five elements including Sn, Cu, Sb, and In, and 20 mass % or less of Ag. The solidus temperature of the solder material is higher than 290° C., the liquidus temperature of the solder material is 379° C. or less and is higher than the solidus temperature, and the temperature difference between the liquidus temperature and the solidus temperature is 70° C. or less.

9 Claims, 12 Drawing Sheets

(56) References Cited

U.S. PATENT DOCUMENTS

| | | | | |
|---|---|---|---|---|
| 2015/0217410 A1* | 8/2015 | Fujimaki | ............. | B23K 35/262 |
| | | | | 403/272 |
| 2015/0224604 A1* | 8/2015 | Choudhury | .......... | B23K 1/0016 |
| | | | | 403/272 |
| 2015/0328722 A1* | 11/2015 | Suzuki | .................. | B23K 35/26 |
| | | | | 403/272 |

* cited by examiner

SOLDER MATERIAL AND ELECTRONIC COMPONENT

CROSS-REFERENCE TO RELATED APPLICATIONS

This application is based on and claims priority under 35 U.S.C. § 119 to Japanese Patent Application Nos. 2015-20559 filed on Feb. 4, 2015, 2015-125871 filed on Jun. 23, 2015, and 2015-243504 filed on Dec. 14, 2015, the entire contents of which are incorporated herein by reference.

TECHNICAL FIELD

This disclosure relates to a solder material and an electronic component mounted on a circuit board using the solder material.

DESCRIPTION OF THE RELATED ART

A small-sized electronic element, such as a surface acoustic wave device and a crystal resonator, is housed within a small container to constitute a surface mount device, and the surface mount device is mounted on a circuit board such as a wiring board. For example, at this time, a solder material is used as a sealing material that airtightly seals the container of the surface mount device.

In a process of mounting such surface mount device on the surface of the wiring board, the solder material for surface mounting is applied, for example, between an electrode pad of the surface mount device and an electrode formed on the wiring board, and then a reflow process, which heats the surface mount device to temperatures, for example, near 260° C. in a reflow furnace, is performed. The reflow process melts the solder for surface mounting and electrically connects the electrode pad of the surface mount device and an electrode terminal on the wiring board.

However, when a solidus temperature, which is a temperature at which the solder material that seals the container solidifies, is lower, the solder material is remelted in the reflow process. This may cause poor airtightness and an internal pressure rise in the surface mount device that requires reduced-pressure airtightness, and may cause possibility that the lid portion of the container is removed.

Therefore the solder material that is used to seal a container of a surface mount device is required to have a solidus temperature, at which the solder material solidifies, that is higher than 260° C. Further, in a sealing process of the container of the surface mount device, prevention of melting of an adhesive that secures a small component housed in the surface mount device is required. This requires that the solder material used as the sealing material melts at lower temperatures as much as possible, and thus the liquidus temperature of the solder material is lower.

In a product where the inside of the container is vacuumed to seal, the solder material is heated and melted in a vacuum atmosphere, and is then cooled and solidified to seal. However, due to small heat conduction in the vacuum, it takes longer hours to cool the solder material. This causes a problem that a sealing operation of the container takes longer hours when a difference between the solidus temperature and the liquidus temperature is large.

Conventionally, the solder material with gold and tin mixed, which has a eutectic point at around 280° C., has been used as the sealing material for such container. However, since gold is expensive, there has been a need for the solder material with no gold in recent years. Furthermore, as another example for the preferable solder material, the solder material with lead is known. However, there is a need for the solder material without use of lead in consideration of the environment.

International Publication No. WO 2007/055308 discloses a solder material with bismuth (Bi) as a main material, where the solidus temperature is 255° C. or higher. However, Bi has a property that the volume thereof expands at ordinary temperature, and is therefore inappropriate as the sealing material that airtightly seals a clearance of a container.

A need thus exists for a solder material and an electronic component that are not susceptible to the drawback mentioned above.

SUMMARY

An solder material according to an aspect of the disclosure includes an alloy of at least five elements that includes Sn, Cu, Sb, In, and 20 mass % or less of Ag. The solder material has a solidus temperature higher than 290° C., and a liquidus temperature that is 379° C. or less and is higher than the solidus temperature. The temperature difference between the liquidus temperature and the solidus temperature is 70° C. or less.

The foregoing and additional features and characteristics of this disclosure will become more apparent from the following embodiments considered with reference to the accompanying drawings.

EMBODIMENTS

Figure 1:
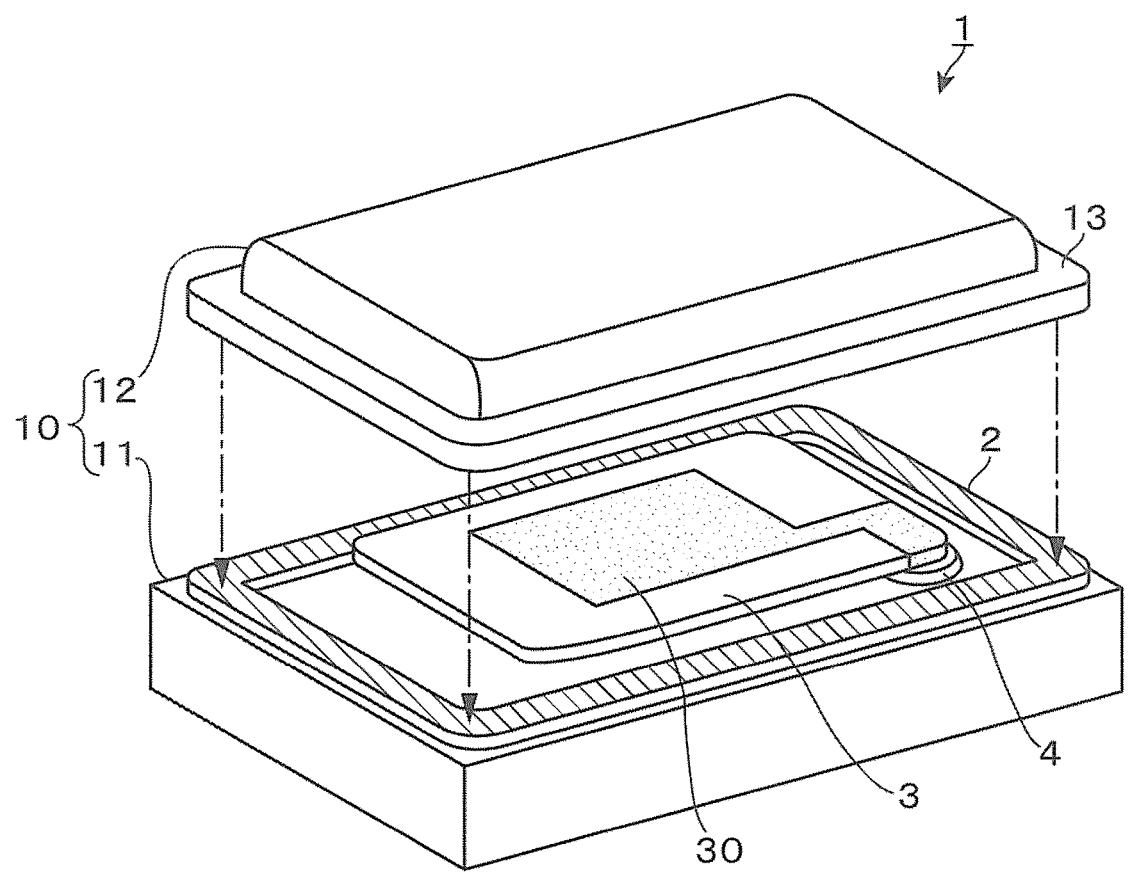
FIG. 1 is an exploded perspective view of an electronic component according to an embodiment disclosed here.

A description will be given of a solder material according to an embodiment disclosed here, but the scope of this disclosure is not limited thereto. The solder material of the embodiment includes solder powders made of a five-element alloy, which contains: Sn (tin) in an amount of 25 to 45 mass %, Sb (antimony) in an amount of 30 to 40 mass %, Cu (copper) in an amount of 3 to 8 mass %, In (Indium) in an amount of 3 mass % to 9 mass %, and Ag (silver) constituting the remaining portion. The solder material is configured as solder paste that is a paste formed by being mixed with, for example, a flux.

Sn is a dominant factor that determines the solidus temperature of the solder material. The larger the amount of Sn in the solder powders, the lower the solidus temperature becomes. The solidus temperature of the solder material disclosed here is aimed to be set over 260° C., for example, 290° C. or higher, and thus the amount of Sn in the solder powders is preferably in the range of 25 to 45 mass %.

In is a dominant factor that determines the liquidus temperature. The larger the amount of In in the composition is, the higher the liquidus temperature tends to be. As the amount of In becomes larger, a temperature zone where the solder material becomes a solid-liquid state gets wider and the liquidus temperature tends to become unstable. Further, the solder material becomes susceptible to the melting point of In and is likely to melt at a lower temperature zone. Therefore, the amount of In is preferably in the range of 3 to 9 mass %. Adding In generally tends to lower the solidus temperature and the liquidus temperature.

Ag has an effect to keep stability of bonding the solder material. Good stability of bonding means that when soldering with use of this solder material, the solder material has a high mechanical strength after the melted solder material solidifies. Further, specifically, this means that, in the surface mount device, the bonding strength between a substrate body and a lid portion is high when the substrate body and the lid portion are bonded with this solder material. However, when the amount of Ag becomes larger, the inside of the solder material is likely to crystallize, and increase of these crystals deteriorates wettability. A larger content of Ag increases the production cost. Thus, the amount of Ag in the solder powders is preferably 20 mass % or less. When the amount of Ag becomes larger, the temperature at which the solder material begins to melt becomes susceptible to the temperature of the melting point of Sn. Reducing the amount of Ag can inhibit lowering of the solidus temperature of the solder material.

Cu has an effect to adapt the crystals between the respective compositions. To adapt the crystals means to strengthen binding of the crystals of the respective metals in this solder material with one another. However, when Cu is excessively added, the melting temperature of the generated solder material substantially rises and the hardness becomes high. Thus, the content of Cu is adjusted to be in the range of 3 to 8 mass % with respect the solder material.

Further, although, in the solder material including, for example, more amount of Ag, Cu, a eutectic point becomes high and eutectic crystals becomes easily formed when generating the solder material, adding Sb is preferred because it can lower the eutectic point. A larger amount of Sb makes the solder material more spreadable when the solder material is melted, and improves wettability. Further, a larger amount of Sb can make the solidus temperature higher. However, if the amount of Sb is excessive, Sb in the solder material recrystallizes in the molten solder material and the crystals of Sb are scattered. This may degrade the quality of the solder material. Therefore, the amount of Sb is preferably in the range of 30 to 40 mass %.

The solder material may include Si (silicon) and Ti (titanium) by 0.1 mass % or less, respectively. As described in Working Examples below, inclusion of Si and Ti makes an inclination of a differential scanning calorimetry curve steep. The reason for this is considered to be that, by adding Si and Ti, the particles constituting the solder easily become fine particles because the crystals forming the solder become finer, and transition from a solid to a liquid becomes apparent. A larger amount of Si has a disadvantage that Si becomes easily remaining as the crystals, and thus the content of Si is preferably 0.1 mass % or less, and more preferably 0.05 mass % or less. Further, since Ti is hard and has a property to become dross, a larger amount of Ti may increase the viscosity of the solder material. Thus, the content of Ti is preferably 0.1 mass % or less, and more preferably 0.03 mass % or less. Therefore, inclusion of Si and Ti by 0.1 mass % or less, respectively, makes the transition from a solid to a liquid of the solder material become apparent, and much more reduces the possibilities of insufficient melting of the solder material and the possibilities of removal of a member secured by the solder material insufficiently solidified.

Zn (zinc) and Pd (palladium) may be included by 0.1 mass % or less in the solder material, respectively. Adding Zn or Pd can improve high temperature durability of the solder and keep high strength even when the temperature rises up to a temperature zone near the liquidus temperature. A large amount of Zn or Pd may cause the temperature difference between the liquidus temperature and the solidus temperature to become large. Therefore, the content of Zn and Pd is preferably 0.1 mass % or less, and more preferably 0.05 mass % or less.

Further, to improve the fluidity of the solder material and strengthen the mechanical strength of the solder material, trace elements, for example, such as Ni, Fe, Mo, Cr, Mn, Ge, and Ga, may be included in a range that does not exceed 1 mass %, respectively.

A description will be given of production method of the solder material according to an embodiment disclosed here. Firstly, Sn, Sb, Cu, In and Ag are respectively pulverized to be respective metal powders in a particle shape, by using a known crusher such as a turbo mill, a roller mill, a centrifugal force pulverizer or a pulverizer. At this time, excessively large particles of the metal powders causes poor printability of the solder paste, which is generated with the particles of the metal powders, onto a circuit board. Excessively small particles of the metal powders cause poor wettability of the solder paste when the solder paste is heated. Thus, the particle diameter of these metal powders are preferably made to be in a range of 5 μm to 50 μm, in terms of the average sphere-equivalent particle diameter, by using a known particle size distribution measurement method, such as particle image measuring, or zeta potential measuring. Then, the respective metal powders are respectively weighed, for example, in a manner that Sn becomes 38 mass %, Sb becomes 36 mass %, Cu becomes 5 mass %, In becomes 5 mass %, and Ag becomes 16 mass %, and are then mixed.

The mixed metal powders are melted, for example, inside a heated crucible to generate molten metal, and then the molten metal is granulated by, for example, a known centrifugal spray atomization method. The centrifugal spray atomization method continuously supplies the molten metal in the crucible on a rotary disc that rotates with high speed and sprays the molten metal in a peripheral area by the centrifugal force of the rotary disc. The sprayed molten metal is cooled and solidifies in the atmosphere to become fine particles, and thus solder powders are granulated. Such solder powders are mixed with a flux to generate the solder paste.

As a flux that constitutes the solder paste, the flux that includes material such as a tackifier resin such as rosin, a thixotropic agent, activator, and solvent can be used. The flux can be used regardless of the difference of the degree of activity that the flux has.

Then, a description will be given of an electronic component that uses the solder paste. The solder paste is used for a surface mount device 1 secured on a surface of a circuit board by using a solder for surface mounting. For example, when an electronic element is housed in a container 10 to constitute the surface mount device 1, the solder paste is used for sealing the container 10. As illustrated in FIG. 1, for example, the electronic element such as a crystal resonator 3 is housed in the airtight container 10 in a vacuum or inert gas atmosphere to constitute the surface mount device 1, and the surface mount device 1 is mounted on a wiring board.

The container 10 includes, for example, a plate-shaped substrate body 11 made of ceramic and a metallic lid portion 12, and houses, for example, the crystal resonator 3 therein. The substrate body 11 is formed from a ceramic substrate. An annular solder paste 2 is printed, for example, by screen-printing over the whole circumference of the edge portion of each of the substrate bodies 11 in the ceramic substrate before the respective substrate bodies 11 are cut out from the ceramic substrate. Then, in each of the portions that correspond to the respective substrate bodies 11 in the ceramic substrate, formed are an electrode 30 for vibration-excitation for the crystal resonator 3, wiring, and an electrode pad for electrical connection with the wiring board, on which the surface mount device 1 is mounted, and then each portion is cut out in the shape of the substrate body 11.

Subsequently, the wiring formed in the substrate body 11 and the electrode 30 formed in the crystal resonator 3 are electrically connected by a conductive adhesive 4.

The lid portion 12 is formed in a substantially box shape with an opening in an inferior surface side by, for example, deep drawing, and an edge portion 13 is formed protruding outward over the whole circumference in the inferior surface of the lid portion 12. After the edge portion 13 of the lid portion 12 is placed on the solder paste 2 printed on the substrate body 11, the lid portion 12 and the substrate body 11 are carried into, for example, a reflow furnace and heated at a temperature of 380° C. This melts and expands the solder paste 2 between the edge portion 13 of the lid portion 12 and the surface of the substrate body 11 to form a clearance airtightly sealed between the lid portion 12 and the substrate body 11. At this time, the lid portion 12 may be brought into pressure contact with the substrate body 11 by a tool, for example, inside the reflow furnace. Subsequently, halting the heating to lower the temperature causes the solder paste 2 to solidify.

The surface mount device 1 produced at electronic component suppliers is mounted on a circuit board, for example, by a user that uses the surface mount device 1 to assemble electrical apparatuses. For example, the solder for surface mounting for securing the surface mount device 1 is applied over the electrode pads formed on the surface of the circuit board, and the respective electrode pads of the surface mount device 1 is placed such that they come into contact with the corresponding solder for surface mounting, respectively. For the solder for surface mounting, for example, the solder of which the liquidus temperature is 260° C. or lower is used. Subsequently, this circuit board is carried into a reflow furnace and is heated to 260° C. by, for example, $N_2$-reflow method. Heating inside the reflow furnace melts the solder for surface mounting and causes the electrode pads of the surface mount device 1 and the electrodes of the circuit board side to electrically connect. Subsequently, after the circuit board is taken out of the reflow furnace and its temperature is lowered to solidify the solder for surface mounting, the flux attached on the surface of the circuit board and surface mount device 1 is cleaned and removed.

The solder paste according to the embodiment described above is solder powders constituted of a five-element alloy including: Sn in an amount of 25 to 45 mass %, Sb in an amount of 30 to 40 mass %, Cu in an amount of 3 to 8 mass %, In in an amount of 3 to 9 mass %, and Ag constituting the remaining portion. The proportions of Sn, Sb, Cu, and In are chosen such that the proportion of Ag does not exceed 20 mass %. Consequently, as is apparent from the Working Examples described later, the solder powders are made to have a solidus temperature of 260° C. or higher, a liquidus temperature that is 379° C. or lower and is higher than the solidus temperature, and a difference of 70° C. or less between the solidus temperature and the liquidus temperature. This can set the temperature at which the surface mount device 1 is sealed to be a lower temperature. Further, in the reflow process when this surface mount device 1 is mounted on the circuit board, the solder paste 2 used as the sealing material for the surface mount device 1 is not remelted. This eliminates the possibility that the airtightness of the surface mount device 1 becomes poor and the lid portion 12 drops off.

The solder paste 2 described above has a larger displacement amount in the height dimension and has favorable wettability, as indicated in the Working Example described later. Consequently, sealing the container 10 with use of the solder paste 2 narrows the clearance between the lid portion 12 and the surface of the substrate body 11 and can closely seal because the solder paste 2 reliably spreads in the clearance. Further, as indicated in the Working Example described below, although setting the content of Ag to be 48 mass % or more can make the solidus temperature to be 260° C. or higher and the liquidus temperature to be 379° C. or lower, the production cost becomes high. The solder paste 2 according to the embodiment disclosed here sets the content of Ag to be 20 mass % or less, and thus the production cost can be reduced.

In the surface mount device 1 according to another example of the embodiment disclosed here, by covering an opening portion of a rectangular-shaped substrate body 21 with an opening top surface by a plate-shaped lid portion 22, a clearance where the electronic element such as the crystal resonator 3 is to be placed may be formed between the lid portion 22 and the substrate body 21. The substrate body 21 and the lid portion 22 constitute a container 20.

Figure 2:
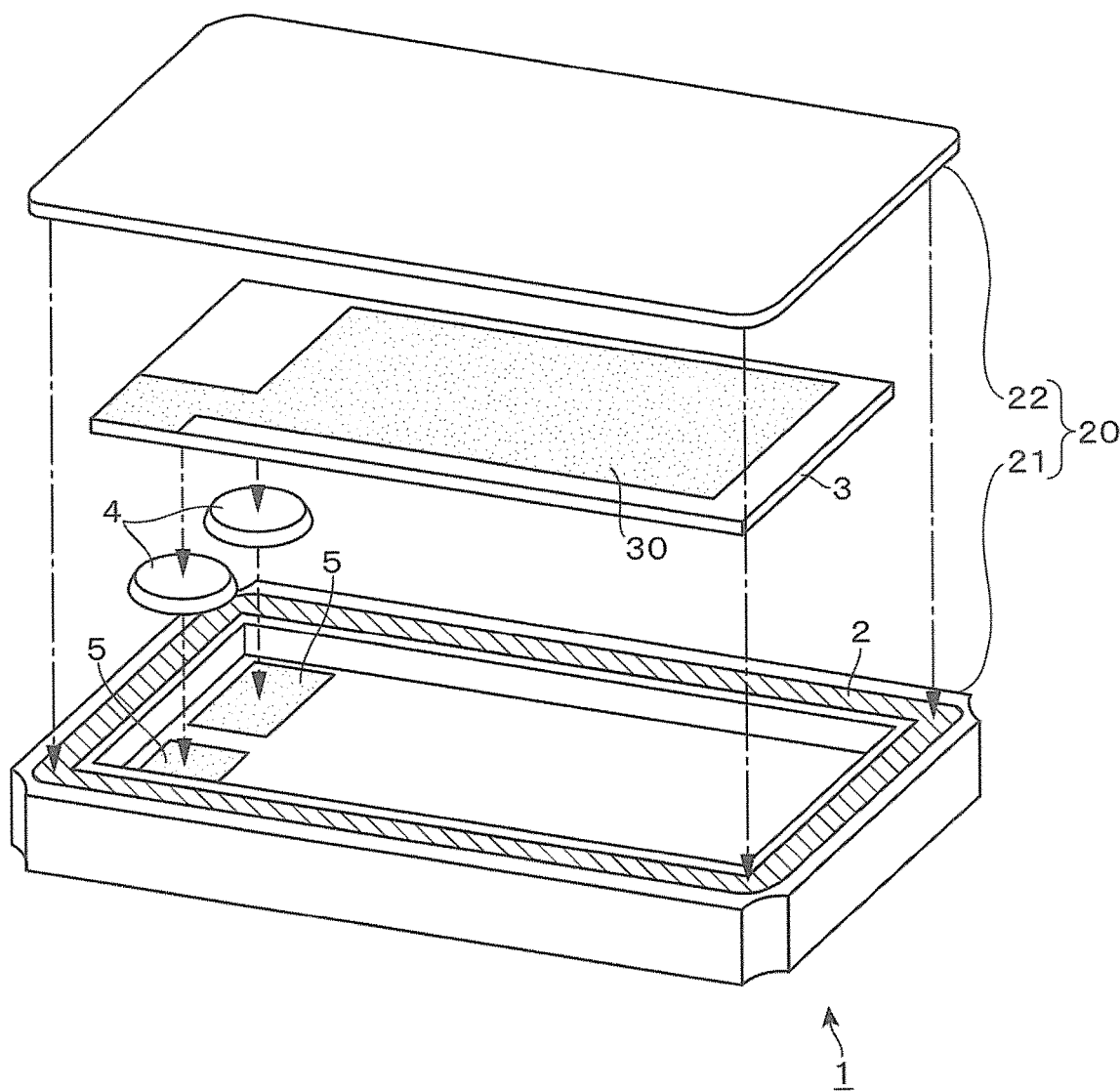
FIG. 2 is an exploded perspective view of a surface mount device according to another example of the embodiment disclosed here.

As illustrated in FIG. 2, for example, the substrate body 21 of the container 20 is formed in a substantially box shape with an upside opening upward. In the inner bottom surface of the substrate body 21, electrodes 5, which are electrically connected to electrode pads (not illustrated) arranged in the inferior surface side of the bottom surface of the substrate body 21, are formed. Firstly, these electrodes 5 are electrically connected to the electrodes 30 formed in the crystal resonator 3 with the conductive adhesive 4.

Subsequently, the solder paste 2 is supplied on the top surface of the sidewall of the substrate body 21 by screen-printing, and then is pressed and spread on the whole top surface of the sidewall of the substrate body 21 by, for example, a squeegee.

Then, under a vacuum atmosphere or an inert gas atmosphere, the plate-shaped lid portion 22 is placed on the upper side of the solder paste 2, which has been pressed and spread on the top surface of the sidewall of the substrate body 21, and is heated to, for example, 380° C. This melts the solder paste 2, and the solder paste 2 spreads between the lid portion 22 and the top surface of the sidewall of the substrate body 21 by further causing the lid portion 22 and the substrate body 21 to be brought into pressure contact. Subsequently, when the solder paste 2 is cooled to solidify, the substrate body 21 and the lid portion 22 are airtightly bonded. Further, subsequently, the flux attached to the surface mount device 1 is removed by, for example, water cleaning.

The electronic element may be a surface acoustic wave device, a microelectromechanical system (MEMS), a sensor that detects a pressurizing rate by detecting a deflection of a crystal element electrically, or the like. Further, when an electronic element such as MEMS is formed on the surface of the circuit board, and the lid portion is arranged to cover the electronic element, an electronic component where a lid portion and a circuit board are sealed by the solder paste 2 described above may be suitable. In this case, the container that defines the arrangement space of the electronic element is constituted of the lid portion and a part of the circuit board that doubles as the base portion. Consequently, when other surface mount device is mounted on the surface of the circuit board, remelting of the solder paste is inhibited when heated, and thus a similar effect can be obtained. Further, the temperature difference between the liquidus temperature and the solidus temperature of the solder material is also preferably 70° C. or less.

One of the characterizing portions disclosed here is to use the solder paste described above to the container. The term of "using a solder material to a container" should not be construed in a limiting sense that the solder material is used as a sealing material for airtightly sealing the base portion and the lid portion, which constitute the container, For example, some electronic components are constituted by enclosing an acoustic wave device in a container, then mounting the electrode on one side of the surface of the container to the electrode on the wiring board via a solder material, and then resin-sealing (so-called "molding") the container by a mold material such as an epoxy-based resin over the whole container, from the surface of the wiring board. These electronic components are mounted on this wiring board, for example, such that the electrode formed on the back surface side of the wiring board is connected to the electrode on the circuit board of an electronic equipment side. In this case, the term of "using a solder material to a container" in this disclosure includes a situation that the solder material described above is used as the solder material for connecting the electrode of the container side to the electrode of the wiring board side.

EXAMPLES

To confirm effectiveness of the solder material disclosed here, the solidus temperature and the liquidus temperature were examined by variously varying the component and composition of the alloy constituting the solder material. The solder materials corresponding to this disclosure are those of Working Example 1 to 27, and the solder materials corresponding to comparative examples are those of Comparative Example 1 to 9.

Working Example 1

The composition ratio was set such that solder material contains 38.0 mass % of Sn, 36.0 mass % of Sb, 15.0 mass % of Ag, 5.0 mass % of Cu, and 6.0 mass % of In. This solder material was manufactured by a known manufacturing method of a solder material described in the embodiment disclosed here.

Working Examples 2 to 27

These solder materials were manufactured similar to Working Example 1, except that the composition ratios of the solder materials were set as indicated in Table 1 described later.

Comparative Examples 1 and 2

These solder materials were manufactured similar to Working Example 1, except that In was not used, and the composition ratios of Sn, Ag, Sb and Cu were set as indicated in Table 1 described later.

Comparative Example 3

This solder material was manufactured similar to Working Example 1, except that Sb and In were not used, and the proportions of Sn, Ag and Cu were set to 77.0 mass %, 17.0 mass %, and 6.0 mass %, respectively.

Comparative Example 4

This solder material was manufactured similar to Working Example 1, except that Sb was not used, and the proportions of Sn, Ag, Cu, and In were set to 25.0 mass %, 50.0 mass %, 15.0 mass %, and 10.0 mass %, respectively.

Comparative Examples 5 to 9

These solder materials were manufactured similar to Working Example 1, except that the composition ratios were set as indicated in Table 1 described later.

With respect to each of the solder materials manufactured as above, a melting temperature range was measured based on JIS Z 3198-1, and the liquidus temperature and the solidus temperature were determined. The melting temperature range was measured by obtaining a differential scanning calorimtry curve using a differential scanning calorimeter (Thermo plus EVO II/DSC8230: manufactured by Rigaku). The differential scanning calorimetry curves in Working Examples 1, 2, 6 and 12 are indicated below as representatives of Working Examples 1 to 27. Further, the differential scanning calorimetry curve in the Comparative Example 9 is indicated as the representative of the comparative examples.

Figure 3:
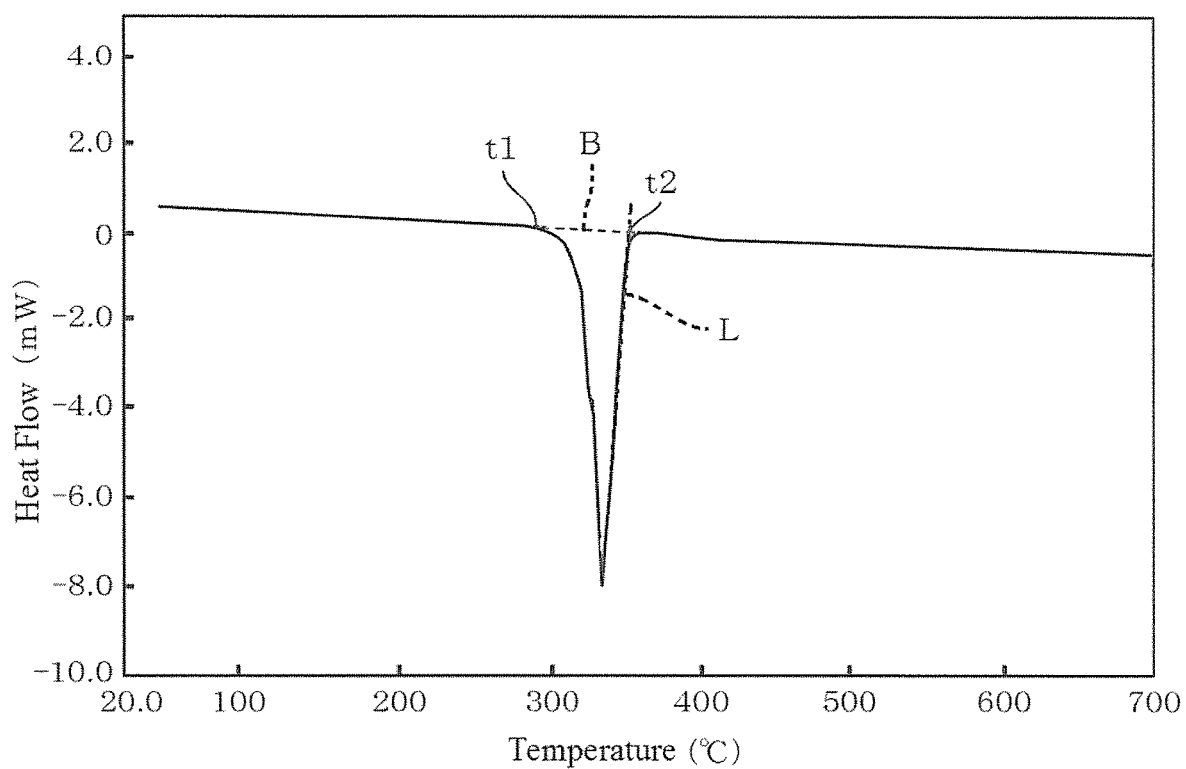
FIG. 3 is a differential scanning calorimetry curve of a solder material according to Working Example 1.
Figure 4:
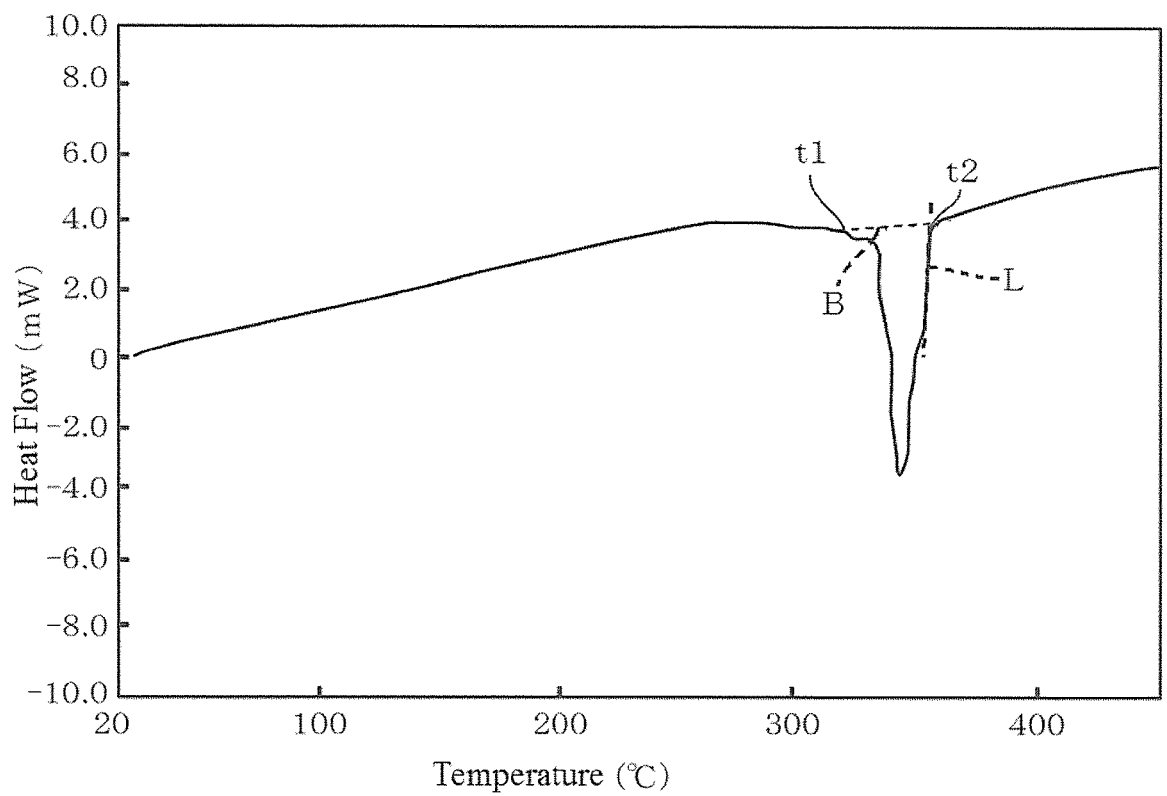
FIG. 4 is a differential scanning calorimetry curve of a solder material according to Working Example 2.
Figure 5:
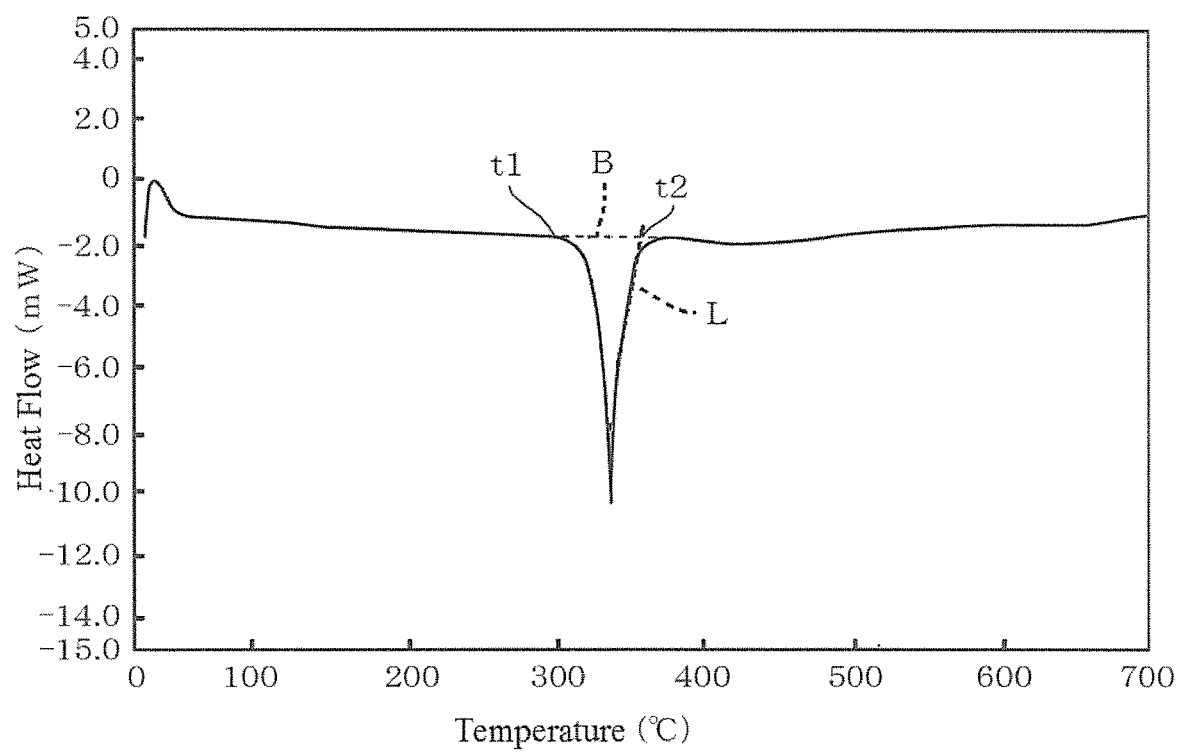
FIG. 5 is a differential scanning calorimetry curve of a solder material according to Working Example 6.
Figure 6:
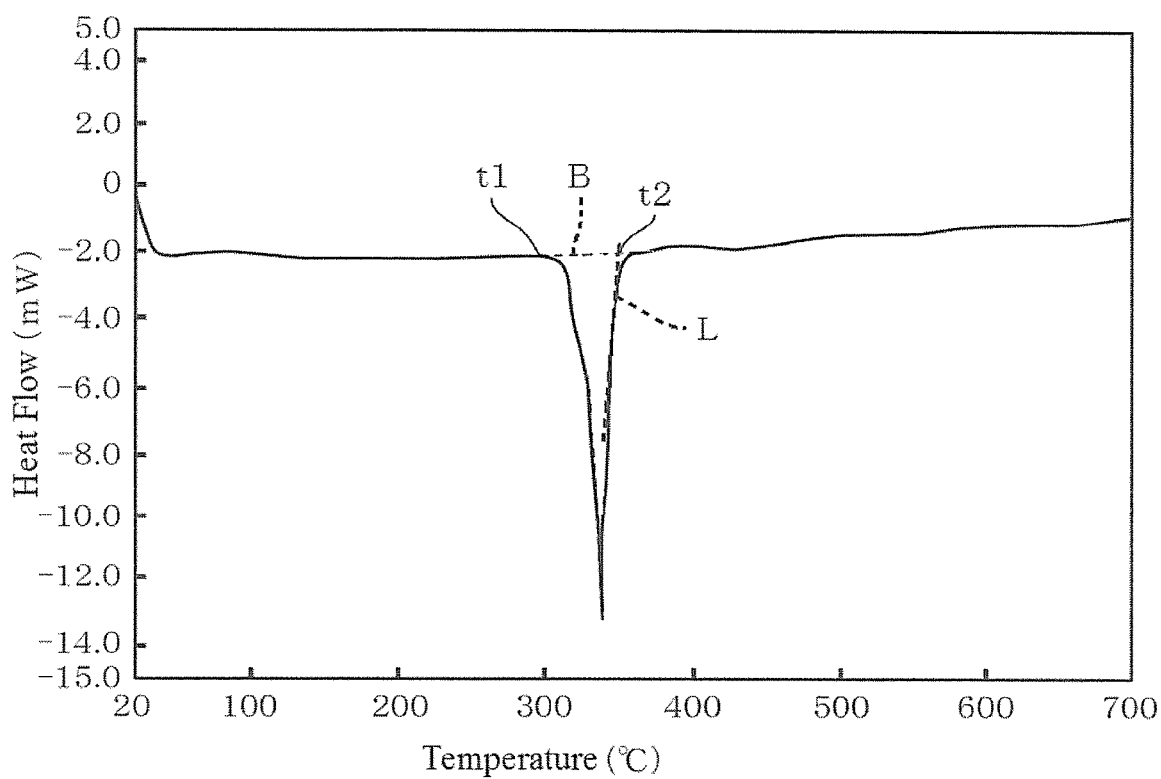
FIG. 6 is a differential scanning calorimtry curve of a solder material according to Working Example 12.
Figure 7:
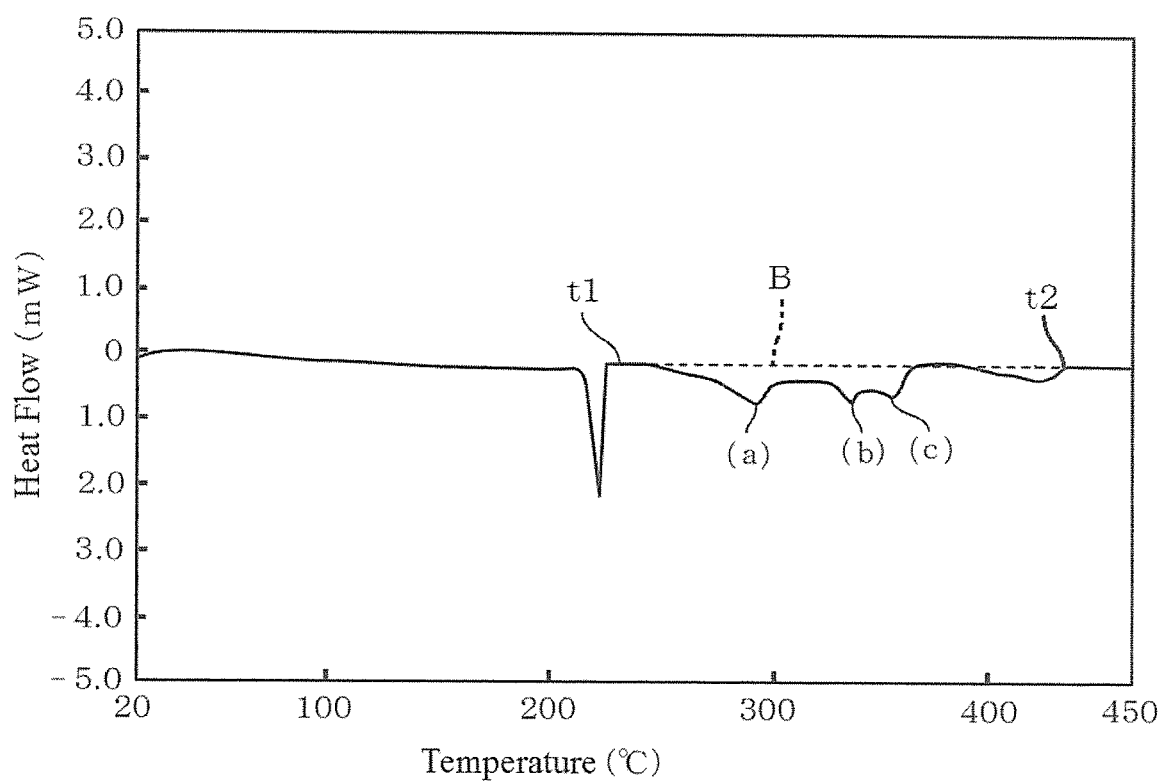
FIG. 7 is a differential scanning calorimetry curve of a solder material according to Comparative Example 9.

FIG. 3 to FIG. 6 illustrate the differential scanning calorimetry curves at respective temperatures of the solder materials of Working Example 1, 2, 6 and 12, respectively. FIG. 7 illustrates the differential scanning calorimetry curve at respective temperatures of the solder material of Comparative Example 9. FIG. 3, FIG. 5 and FIG. 6, which correspond to Working Example 1, 6 and 12, respectively, indicate the differential scanning calorimetry curves when the temperature was raised at a rising rate of 10° C./min from room temperature (approximately 20° C.) up to 700° C. FIG. 4 corresponding to Working Example 2 and FIG. 7 corresponding to Comparative Example 9 indicate the differential scanning calorimetry curves when the temperature was raised at a rising rate of 10° C./min from room temperature (approximately 20° C.) up to 450° C. The examples of FIG. 3 to FIG. 7 indicate the respective differential scanning calorimetry curves when the temperature was raised at a rising rate of 10.0° C./min. The temperature when the differential scanning calorimetry curve started to separate from a base line in a lower temperature side was set to be a solidus temperature t1. Further, when the differential scanning calorimetry curve hardly decreased after it started to separate from the base line and then rapidly separated at a certain temperature, the solidus temperature t1 was set to be the temperature at the intersection point of i) the straight line where the base line in the lower temperature side was extended toward the higher temperature side, and ii) the tangent line drawn at the point where the slope of the curve at the lower temperature side of the melting peak at the lowest temperature side became the largest.

Further, the liquidus temperature t2 was set to be the temperature at the intersection point of i) the straight line B where the base line in the higher temperature side was extended toward the lower temperature side, and ii) the tangent line L drawn at the point where the slope of the curve at the higher temperature side of the melting peak at the highest temperature side becomes the largest.

As illustrated in FIG. 3, in the solder material of Working Example 1, an endothermic reaction, where the smallest value of a valley region that appeared in the differential scanning calorimetry curve became 336° C., was observed. In the solder material of this Working Example 1, the solidus temperature was 303° C., the liquidus temperature was 352° C., and the difference therebetween was 49° C.

As illustrated in FIG. 4, in the solder material of Working Example 2, an endothennic reaction, where the smallest value of the valley region that appeared in the differential scanning calorimetry curve became 343° C., was observed. In the solder material of this Working Example 2, the solidus temperature was 332° C., the liquidus temperature was 355° C., and the difference therebetween was 23° C.

As illustrated in FIG. 5, in the solder material of Working Example 6, an endothermic reaction, where the smallest value of the valley region that appeared in the differential scanning calorimetry curve became 330° C., was observed. In the solder material of this Working Example 6, the solidus temperature was 321° C., the liquidus temperature was 361° C., and the difference therebetween was 40° C.

As illustrated in FIG. 6, in the solder material of Working Example 12, an endothennic reaction, where the smallest value of the valley region that appeared in the differential scanning calorimetry curve became 337° C., was observed. In the solder material of this Working Example 12, the solidus temperature was 317° C., the liquidus temperature was 353° C., and the difference therebetween was 36° C.

In the solder material of Comparative Example 9 illustrated in FIG. 7, an endothermic reaction where the three smallest values (a), (b) and (c) of the valley regions that appeared in the differential scanning calorimetry curve became 294° C., 342° C. and 353° C., respectively, was observed. In the solder material of Comparative Example 9, the solidus temperature was 223° C., the liquidus temperature was 427° C., and the difference therebetween was 204° C.

Thus, the differential scanning calorimtry curves were obtained with respect to Working Examples 1 to 27 and Comparative Examples 1 to 9, and the respective solidus temperatures and liquidus temperatures were obtained, as indicated in Table 1.

TABLE 1

|  | Sn mass % | Sb mass % | Ag mass % | Cu mass % | In mass % | Solidus Temperature (° C.) | Liquidus Temperature (° C.) |
| --- | --- | --- | --- | --- | --- | --- | --- |
| Comparative Example 1 | 84.5 | 14.0 | 1.0 | 0.5 | — | 224 | 231 |
| Comparative Example 2 | 73.0 | 4.0 | 17.0 | 6.0 | — | 195 | 389 |
| Comparative Example 3 | 77.0 | — | 17.0 | 6.0 | — | 223 |  |
| Comparative Example 4 | 25.0 | — | 50.0 | 15.0 | 10.0 | 369 | 500 or more |
| Comparative Example 5 | 29.0 | 13.0 | 49.0 | 3.0 | 7.0 | 303 | 500 or more |
| Comparative Example 6 | 29.0 | 13.0 | 48.0 | 3.0 | 6.0 | 217 | 500 or more |
| Comparative Example 7 | 29.0 | 13.0 | 48.0 | 3.0 | 6.0 | 301 | 500 or more |
| Comparative Example 8 | 29.5 | 12.0 | 50.0 | 3.0 | 5.5 | 222 | 500 or more |
| Comparative Example 9 | 30.0 | 10.0 | 48.0 | 1.5 | 10.5 | 223 | 427 |
| Working Example 1 | 38.0 | 36.0 | 15.0 | 5.0 | 6.0 | 303 | 352 |
| Working Example 2 | 31.4 | 38.9 | 17.1 | 5.7 | 6.9 | 332 | 355 |
| Working Example 3 | 40.0 | 34.0 | 16.5 | 4.0 | 5.5 | 301 | 367 |
| Working Example 4 | 42.0 | 31.5 | 17.0 | 4.0 | 5.5 | 303 | 370 |
| Working Example 5 | 40.0 | 35.0 | 14.0 | 5.0 | 6.0 | 302 | 355 |
| Working Example 6 | 36.0 | 37.0 | 16.0 | 5.0 | 6.0 | 321 | 361 |
| Working Example 7 | 37.0 | 38.0 | 14.0 | 5.0 | 6.0 | 320 | 365 |
| Working Example 8 | 39.0 | 34.0 | 16.0 | 5.0 | 6.0 | 301 | 365 |
| Working Example 9 | 39.0 | 37.0 | 13.0 | 5.0 | 6.0 | 313 | 361 |
| Working Example 10 | 37.0 | 35.0 | 17.0 | 5.0 | 6.0 | 315 | 351 |
| Working Example 11 | 38.0 | 36.0 | 16.0 | 4.0 | 6.0 | 316 | 359 |
| Working Example 12 | 38.0 | 36.0 | 14.0 | 6.0 | 6.0 | 317 | 353 |
| Working Example 13 | 38.0 | 36.0 | 16.0 | 5.0 | 5.0 | 318 | 356 |
| Working Example 14 | 38.0 | 36.0 | 14.0 | 5.0 | 7.0 | 313 | 355 |
| Working Example 15 | 38.0 | 36.0 | 13.0 | 5.0 | 8.0 | 308 | 352 |
| Working Example 16 | 40.0 | 35.0 | 13.0 | 5.0 | 7.0 | 298 | 351 |
| Working Example 17 | 36.0 | 37.0 | 15.0 | 5.0 | 7.0 | 317 | 358 |
| Working Example 18 | 39.0 | 34.0 | 15.0 | 5.0 | 7.0 | 301 | 347 |
| Working Example 19 | 37.0 | 38.0 | 13.0 | 5.0 | 7.0 | 316 | 360 |
| Working Example 20 | 39.0 | 37.0 | 12.0 | 5.0 | 7.0 | 312 | 357 |
| Working Example 21 | 37.0 | 35.0 | 16.0 | 5.0 | 7.0 | 313 | 353 |
| Working Example 22 | 45.0 | 33.0 | 15.0 | 3.0 | 4.0 | 296 | 355 |
| Working Example 23 | 30.0 | 40.0 | 20.0 | 5.0 | 5.0 | 333 | 379 |
| Working Example 24 | 40.0 | 40.0 | 10.0 | 5.0 | 5.0 | 316 | 369 |
| Working Example 25 | 35.0 | 33.0 | 15.0 | 8.0 | 9.0 | 315 | 360 |
| Working Example 26 | 35.0 | 33.0 | 19.0 | 8.0 | 5.0 | 324 | 362 |
| Working Example 27 | 25.0 | 40.0 | 20.0 | 7.0 | 8.0 | 332 | 378 |

According to the result, in Comparative Examples 1 to 3, 6, 8 and 9, the solidus temperatures were lower and below 240° C.

In contrast to this, in Working Examples 1 to 27, the solidus temperatures were included in a range of 296° C. to 333° C., and the liquidus temperatures were from 347° C. to 379° C. The differences between the liquidus temperature and the solidus temperature were from 23° C. to 67° C.

Adding In to the solder material raises not only the solidus temperature but also the liquidus temperature. As is apparent from Comparative Example 9, it can be seen that the liquidus temperature became excessively high when In was added more than 10 mass %. In the solder material constituted of the five-element alloy with Sn, Sb, Ag, Cu, and In, as indicated in Comparative Examples 5 to 8, the solidus temperatures became higher than 290° C., and the liquidus temperatures became 427° C. or higher when Sn was included from 29 mass % to 30 mass %, Ag from 48 mass % to 50 mass %, and Sb from 12 mass % to 13 mass %. As indicated in Comparative Example 4, in the solder material constituted of a four-element alloy with Sn, Ag, Cu, and In, the solidus temperature was 369° C., and the liquidus temperature became 500° C. or higher when Ag was included by 50 mass % or more. In contrast to this, as indicated in Working Examples 1 to 15, the solidus temperature was higher than 290° C., and the liquidus temperature became 379° C. or lower when Sn was included from 25 mass % to 45 mass %, and Sb from 30 mass % to 40 mass %, even when the content of Ag was less than 20 mass %. Thus, according to this disclosure, the solidus temperature can be set to be 290° C. or higher, and the liquidus temperature can be set to be 379° C. or lower while reducing the cost by decreasing the content of Ag to 20 mass % or less.

With respect to Working Example 1 and Comparative Example 2, wettability of the solder material was evaluated by performing a displacement detection wetting test in the solder paste wettability evaluation method (JIS Z3284-4). Further, examples using SAC305 (a solder material constituted of 3.0 mass % of Ag, 0.5 mass % of Cu, and Sn) as the solder material, and using water and rosin as the flux were set as Comparative Examples 10 and 11, respectively. Then, similarly, the wettability of the solder material was evaluated for Comparative Examples 10 and 11. Regarding the displacement detection wetting test, the procedure thereof includes: applying the solder material in a cross shape on a copper substrate, placing a copper individual piece on the upper side of the solder material, and causing the solder material to melt by performing profile heating (temperature gradient: 2 K/second) from the copper substrate side so as to connect the copper individual piece and the copper substrate. The tests were performed by use of the solder materials indicated in the respective Working Example 1 and Comparative Example 2, 10 and 11, and displacement amounts of height positions of the copper individual pieces when the solder materials were heated and melted were measured.

Figure 8:
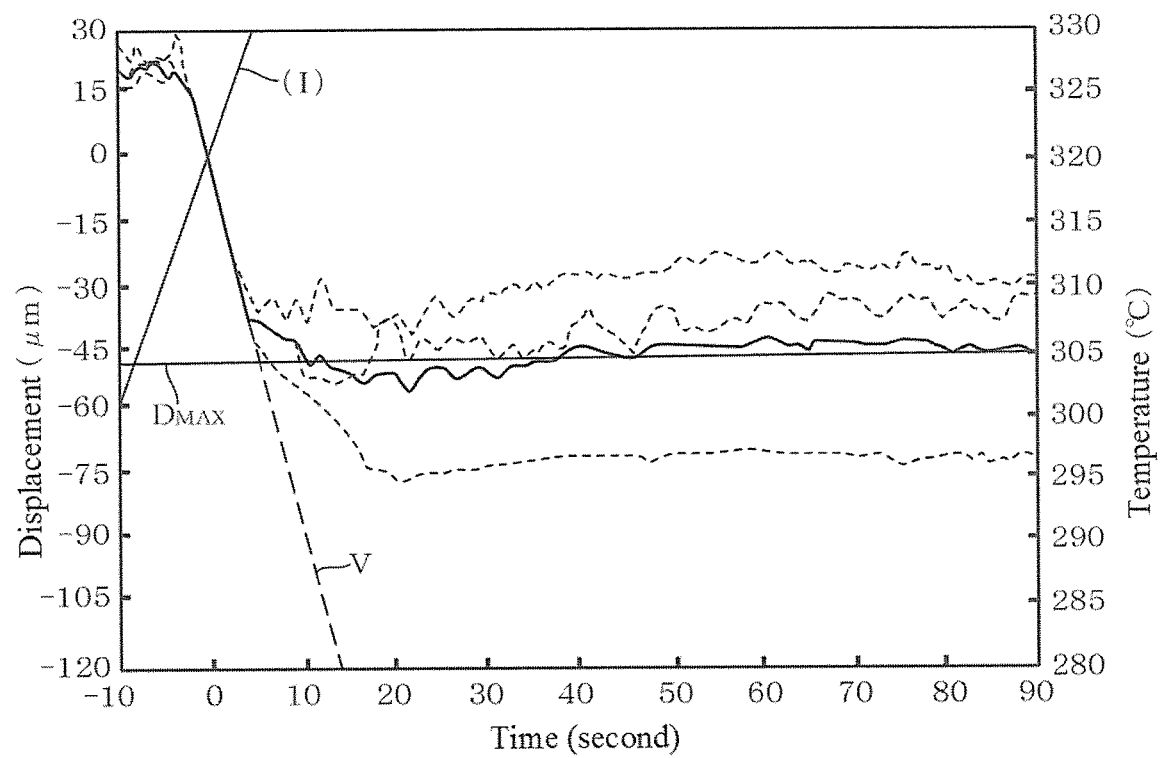
FIG. 8 is a time-displacement curve of the solder material according to Working Example 1.
Figure 9:
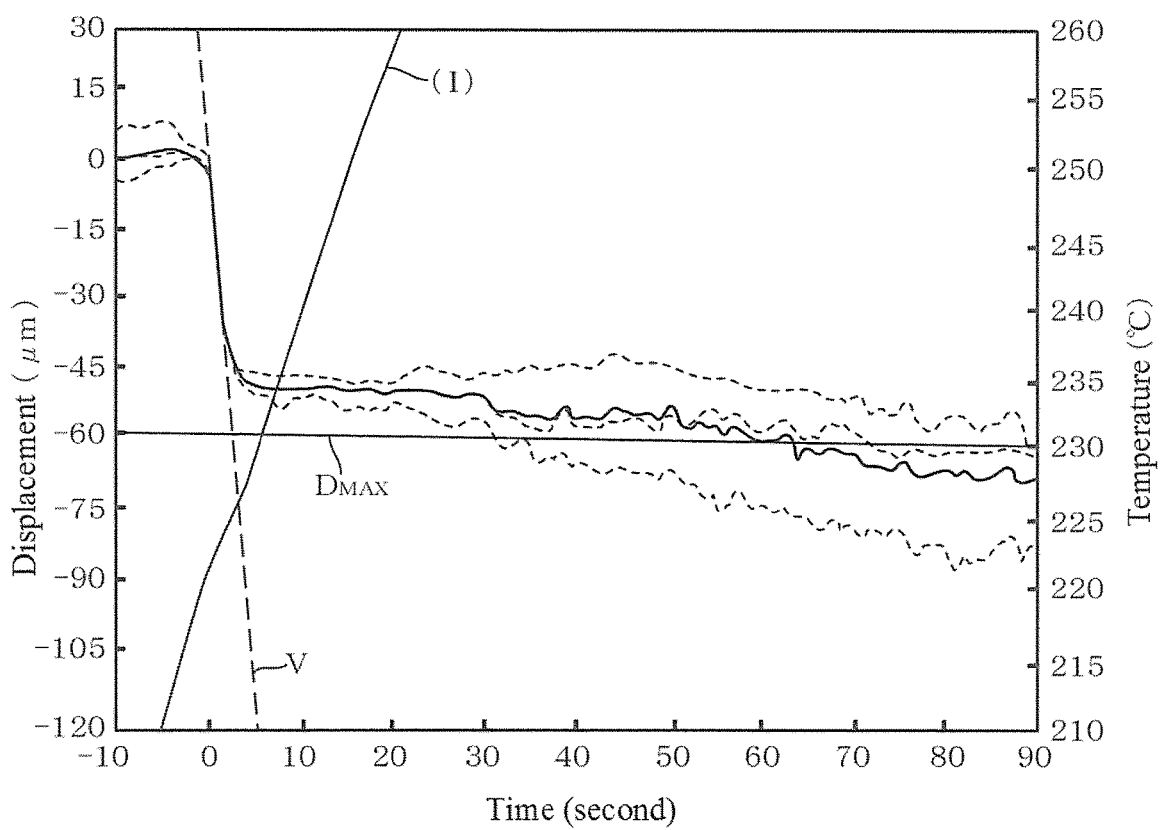
FIG. 9 is a time-displacement curve of the solder material according to Comparative Example 2.
Figure 10:
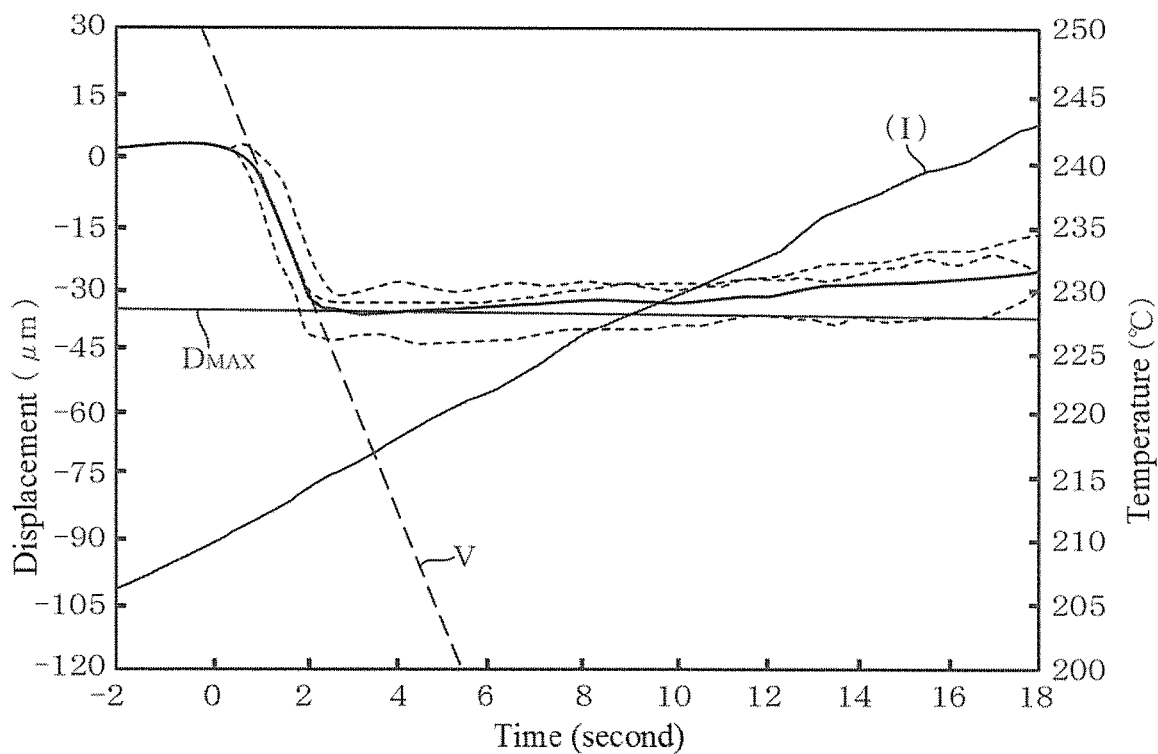
FIG. 10 is a time-displacement curve of a solder material according to Comparative Example 10.
Figure 11:
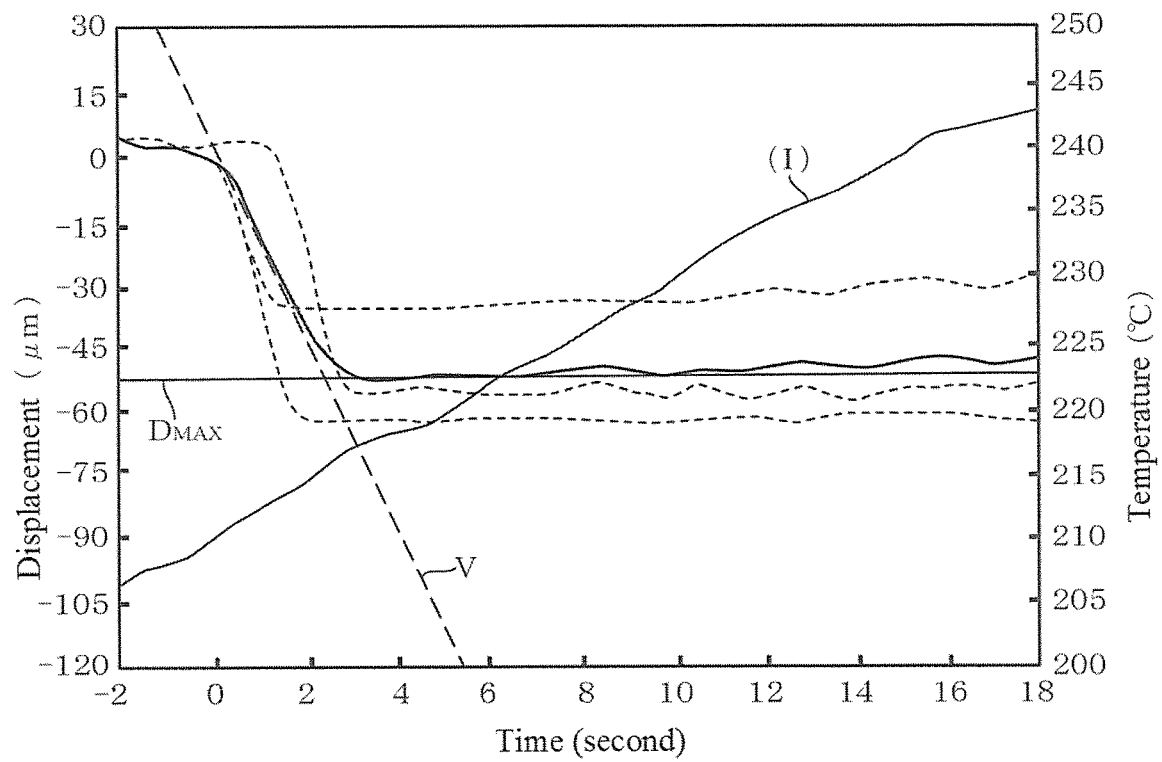
FIG. 11 is a time-displacement curve of a solder material according to Comparative Example 11.

FIG. 8 is a characteristic diagram that illustrates a time-displacement curve when the displacement detection wetting test was performed for the solder material of Working Example 1. FIGS. 9 to 11 are the characteristic diagrams that illustrate the time-displacement curves obtained by the displacement detection wetting tests for the solder materials of Comparative Example 2, 10 and 11, respectively. In each of FIG. 8 to FIG. 11, the horizontal axis indicates the time, and the time point at which the temperature of the copper substrate reached to the solidus temperatures of the corresponding solder material indicated in Table 1, is set to be time 0. The vertical axis in FIG. 8 to FIG. 11 indicates the displacement amount of the height position of the copper individual piece. In the displacement amount, a height displacement $D_0$ of the copper individual piece at the time 0 for each of Working Example 1 and Comparative Examples 2, 10 and 11 is set to be 0. Indicated as a negative displacement is the displacement in the direction where the gap between the copper individual piece and the copper substrate become narrower when the copper individual piece moves down. The solidus temperature of SAC305 was set to be 217° C.

In the working examples and the respective comparative examples, three time-displacement curves, which are indicated by dashed lines in the drawings, were obtained, and then the average time-displacement curve, which is indicated by the solid line in the drawings, was obtained from the average values of the three time-displacement curves.

In the average time-displacement curves in FIG. 8 to FIG. 11, after the height position of the copper individual piece was displaced by heating the solder material, the value of the displacement amount when the displacement amount indicated by the time-displacement curve stabilized was set to be a displacement amount $D_{max}$. Further, the displacement amount from the $D_0$ to $D_{max}$ was set to 100%, and the slope of a straight line V, which was obtained by regression line processing of a curve where the displacement amount in the time-displacement curve reached from 30% to 70%, was set to be a copper-individual-piece descending speed (μm/second). Further, "(I)" in the respective drawings indicates the temperature of the copper substrate.

As illustrated in FIG. 8, in Working Example 1, the displacement amount $D_{max}$ was −49.0 μm, and the copper-individual-piece descending speed was −9.0 μm/second. As illustrated in FIG. 9 to FIG. 11, in Comparative Example 2, 10 and 11, the displacement amount $D_{max}$'s were −58.4 μm, −39 μm, and −52 μm, respectively, and the copper-individual-piece descending speeds were −21.4 μm/second, −26.8 μm/second, −22.7 μm/second, respectively. In the solder material according to the embodiment disclosed here, it can be seen that the displacement amount $D_{max}$ can be set sufficiently larger, and further the copper-individual-piece descending speed is slow. When the copper-individual-piece descending speed is faster, the solder material may not completely spread. When the copper-individual-piece descending speed is slow, the solder material spreads slowly and widely, and thus the solder material reliably spreads in the clearance and the wettability is improved.

Further, with respect to Working Example 1, Young's modulus (GPa), a thermal expansion coefficient (ppm/° C.), and hardness (MPa) were also measured, and they were 71.9 GPa, 18.5 ppm/° C., and 1370 MPa, respectively, which were comparable with a conventional product.

Further, to verify the effect of adding Si, Ti, Zn, and Pd as the trace element, the component and composition of the trace elements added to the solder material indicated in the working example were variously varied, and the solidus temperature and the liquidus temperature were examined.

Working Example 1-2

Working Example 1-2 employed a solder material that was obtained by replacing 0.01 mass % of the mixed solder material of Working Example 1 by 0.005 mass % of Si and 0.005 mass % of Ti.

Working Example 10-2

Working Example 10-2 employed a solder material that was obtained by replacing 0.015 mass % of the mixed solder material of Working Example 10 by 0.005 mass % of Si and 0.01 mass % of Ti.

Working Example 10-3

Working Example 10-3 employed a solder material that was obtained by replacing 0.025 mass % of the mixed solder material of Working Example 10 by 0.005 mass % of Si, 0.01 mass % of Ti, and 0.01 mass % of Pd.

Working Example 10-4

Working Example 10-4 employed a solder material that was obtained by replacing 0.02 mass % of the mixed solder material of Working Example 10 by 0.005 mass % of Si, 0.005 mass % of Ti, and 0.01 mass % of Pd.

Working Example 10-5

Working Example 10-5 employed a solder material that was obtained by replacing 0.04 mass % of the mixed solder material of Working Example 10 by 0.005 mass % of Si, 0.005 mass % of Ti, and 0.03 mass % of Pd.

Working Example 10-6

Working Example 10-6 employed a solder material that was obtained by replacing 0.07 mass % of the mixed solder material of Working Example 10 by 0.005 mass % of Si, 0.005 mass % of Ti, and 0.06 mass % of Zn.

Similarly, for the respective solder materials manufactured as above, the differential scanning calorimetry curves were obtained, the melting temperature ranges were measured based on JIS Z 3198-1, and the liquidus temperature and the solidus temperature were determined.

Table 2 indicates the solidus temperatures and the liquidus temperatures in Working Examples 1-2, 10-2 to 10-6.

curve of Working Example 1-2 has a larger peak of a heat flow than the differential scanning calorimetry curve of Working Example 1. This result indicates that inclusion of Si and Ti in the solder material causes melting of the solder material to proceed all at once with smaller temperature difference from a start of melting.

The solder material may include 25 to 45 mass % of Sn, 30 to 40 mass % of Sb, 3 to 8 mass % of Cu, 3 to 9 mass % of In, and a remaining portion of Ag and inevitable impurities. The solder material may include 36 to 40 mass % of Sn, 34 to 38 mass % of Sb, 4 to 6 mass % of Cu, 4 to 6 mass % of In, and a remaining portion of Ag and inevitable impurities. Further, the solder material may include Si and Ti, respective contents of which may be 0.1 mass % or less. The solder material may include at least one of Zn or Pd, the respective contents of which are 0.1 mass % or less. Further, the solder material may be a paste mixed with a flux. The solder material may be in the form of a preform that is punched out after the solder material was processed into a metal foil.

The electronic component disclosed here is an electronic component that is mounted on a circuit board and includes i) a container housing an electronic element, and ii) the solder material described above, which is used for the container.

In the electronic component disclosed here, the solder material may be used as a sealing material that airtightly seals the container. The container may feature being constituted by sealing a base portion and a lid portion with the solder material, and an atmosphere inside the container is at least one of a depressurized atmosphere and an inert gas atmosphere.

Further, in the electronic component disclosed here, the container is constituted by sealing the base portion and the lid portion with the solder material. The atmosphere inside the container may be at least one of the depressurized atmosphere and the inert gas atmosphere. The container may feature being mounted on a wiring board and being sealed with a resin material over the entirety thereof from the

TABLE 2

| | Sn mass % | Sb mass % | Ag mass % | Cu mass % | In mass % | Si mass % | Ti mass % | Zn mass % | Pd mass % | Solidus Temperature (° C.) | Liquidus Temperature (° C.) |
|---|---|---|---|---|---|---|---|---|---|---|---|
| Working Example 1-2 | 38.0 | 36.0 | 15.0 | 5.0 | 6.0 | 0.005 | 0.005 | — | — | 303 | 352 |
| Working Example 10-2 | 37.0 | 35.0 | 17.0 | 5.0 | 6.0 | 0.005 | 0.01 | — | — | 317 | 359 |
| Working Example 10-3 | 37.0 | 35.0 | 17.0 | 5.0 | 6.0 | 0.005 | 0.01 | — | 0.01 | 316 | 362 |
| Working Example 10-4 | 37.0 | 35.0 | 17.0 | 5.0 | 6.0 | 0.005 | 0.005 | — | 0.01 | 316 | 362 |
| Working Example 10-5 | 37.0 | 35.0 | 17.0 | 5.0 | 6.0 | 0.005 | 0.005 | — | 0.03 | 317 | 364 |
| Working Example 10-6 | 37.0 | 35.0 | 17.0 | 5.0 | 6.0 | 0.005 | 0.005 | 0.06 | — | 315 | 359 |

As indicated in Table 2, Working Examples 1-2, 10-2 to 10-6 have solidus temperatures of 303° C. to 317° C. and liquidus temperatures of 352° C. to 364° C. It can be seen that adding Si, Ti, Zn, and Pd to the solder material indicated in the working examples can also obtain suitable solder material.

Figure 12:
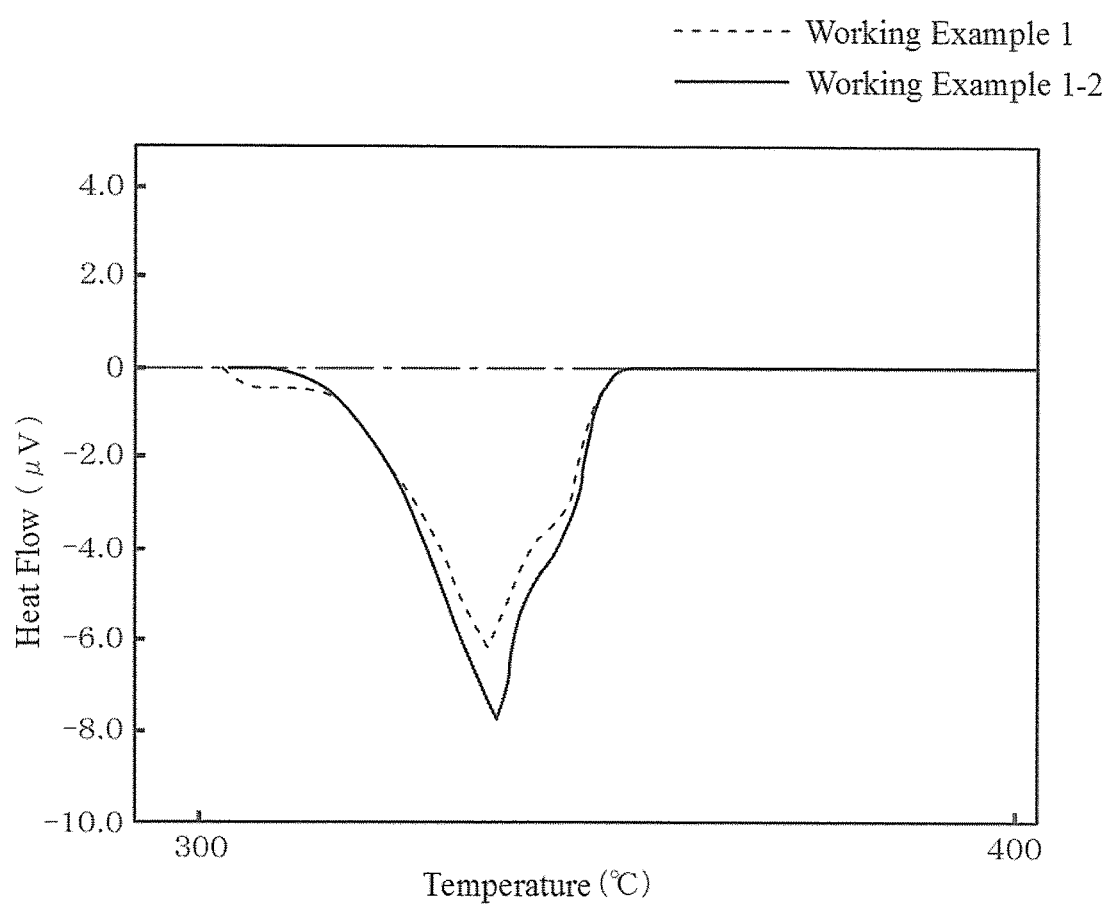
FIG. 12 is a differential scanning calorimetry curve of solder materials according to Working Example 1 and Working Example 1-2.

FIG. 12 illustrates the differential scanning calorimetry curves of Working Example 1 and Working Example 1-2. Although the solidus temperature was 303° C. and the liquidus temperature was 352° C. for both of Working Example 1 and Working Example 1-2, it can be seen that the inclination of the curve in the lower temperature side of the differential scanning calorimetry curve of Working Example 1-2 is steep because the differential scanning calorimetry surface of the wiring board, and the solder material is used to electrically connect an electrode of the container to the wiring board.

The electronic component disclosed here is an electronic component to be mounted on a circuit board, and includes an alloy of at least five elements including Sn, Ag, Cu, Sb and In. By adjusting the amounts of the respective components, the solidus temperature can be configured to be higher than 290° C., the liquidus temperature can be configured to 379° C. or lower, and the temperature difference between the liquidus temperature and the solidus temperature can be configured to be 70° C. or less. This configures lower temperatures when melting the solder material, and further the solder material becomes less likely to melt in a temperature zone where the electronic component is mounted on a circuit board and undergoes a reflow process. Therefore, this configures reduction of insufficient melting of the solder material and reduction of occurrence of failures in association with melting of the solder material when this surface mount device is mounted on the circuit board.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A solder material, comprising:
   an alloy of at least five elements including Sn, Cu, Sb, In, and 20 mass % or less of Ag, wherein
   a solidus temperature of the solder material is higher than 290° C., a liquidus temperature of the solder material is 379° C. or less and is higher than the solidus temperature, and a temperature difference between the liquidus temperature and the solidus temperature is 70° C. or less, and
   the solder material includes 36 to 40 mass % of Sn, 34 to 38 mass % of Sb, 4 to 6 mass % of Cu, 4 to 6 mass % of In, a remaining portion of Ag, and inevitable impurities.

2. The solder material according to claim 1, wherein
   the solder material includes Si and Ti, and respective contents of Si and Ti are 0.1 mass % or less.

3. The solder material according to claim 1, wherein
   the solder material includes at least one of Zn or Pd, and respective contents of Zn and Pd are 0.1 mass % or less.

4. The solder material according to claim 1, wherein
   the solder material includes a paste mixed with a flux.

5. The solder material according to claim 1, wherein
   the solder material is in a form of a preform that is punched out after the solder material is processed into a metal foil.

6. An electronic component for mounting on a circuit board, comprising
   a container that houses an electronic element; and
   the solder material according to claim 1 used for the container.

7. The electronic component according to claim 6, wherein
   the solder material is used as a sealing material to airtightly seal the container.

8. The electronic component according to claim 7, wherein
   the container is constituted of a base portion and a lid portion sealed with the solder material, and
   an atmosphere inside the container is at least one of a depressurized atmosphere and an inert gas atmosphere.

9. The electronic component according to claim 6, wherein
   the container is mounted on a wiring board, and
   the container is sealed with a resin material over the whole container from a surface of the wiring board, and the solder material is used to electrically connect an electrode of the container to the wiring board.

* * * * *